US012683355B2

(12) United States Patent
Wiesend et al.

(10) Patent No.: US 12,683,355 B2
(45) Date of Patent: Jul. 14, 2026

(54) METHOD FOR PRODUCING A COOLING ELEMENT, AND COOLING ELEMENT PRODUCED USING SUCH A METHOD

(71) Applicants: Rogers Germany GmbH, Eschenbach (DE); TRUMPF Photonics, Inc., Cranbury, NJ (US)

(72) Inventors: Johannes Wiesend, Speinshart (DE); Michael Macher, Weiden (DE); Heiko Schweiger, Oberbibrach (DE); Thilo Vethake, Roosevelt, NJ (US); Mark Gottdiener, Trenton, NJ (US)

(73) Assignees: ROGERS GERMANY GMBH, Eschenbach (DE); TRUMPF PHOTONICS, INC., Cranbury, NJ (US)

( * ) Notice: Subject to any disclaimer, the term of this patent is extended or adjusted under 35 U.S.C. 154(b) by 1222 days.

(21) Appl. No.: 17/626,272

(22) PCT Filed: Jul. 7, 2020

(86) PCT No.: PCT/EP2020/069049
§ 371 (c)(1),
(2) Date: Jan. 11, 2022

(87) PCT Pub. No.: WO2021/005024
PCT Pub. Date: Jan. 14, 2021

(65) Prior Publication Data
US 2022/0247150 A1　Aug. 4, 2022

(30) Foreign Application Priority Data
Jul. 11, 2019　(DE) ..................... 10 2019 118 835.0

(51) Int. Cl.
*H01S 5/024* (2006.01)
*H10W 40/47* (2026.01)

(52) U.S. Cl.
CPC ......... *H01S 5/02423* (2013.01); *H10W 40/47* (2026.01)

(58) Field of Classification Search
CPC ............. H01S 5/02423; H01S 5/02407; H01L 23/473; H01L 21/4871; B23H 7/02; B23H 9/00; B23H 11/003; B23H 1/00
See application file for complete search history.

(56) References Cited

U.S. PATENT DOCUMENTS 2,326,152 A * 8/1943 Marbury .................. H01G 2/08
361/274.2
5,718,286 A 2/1998 Damsohn et al.
(Continued)

FOREIGN PATENT DOCUMENTS

DE 60302438 T2 12/2005
DE 10393611 T5 1/2006
(Continued)

OTHER PUBLICATIONS

International Preliminary Report on Patentability for International Application No. PCT/EP2020/069049, International Filing Date Jul. 7, 2020, Date of Mailing Jan. 13, 2022, 7 pages.

*Primary Examiner* — Xinning(Tom) Niu
(74) *Attorney, Agent, or Firm* — CANTOR COLBURN LLP

(57) ABSTRACT

A method for manufacturing a cooling element (1) for an electrical or electronic component, in particular a semiconductor element, the manufactured cooling element (1) having a cooling fluid channel system through which a cooling fluid can be passed during operation, comprising
　providing at least a first metal layer (11)
　realizing at least one recess (21, 22) in the at least one first metal layer (11), and
　forming at least a partial section of the cooling fluid channel system by means of the at least one recess (21, 22), (Continued)

wherein at least a first part (21) of the at least one recess (21, 22) in the at least first metal layer (11) is realized by erosion, in particular spark erosion.

28 Claims, 4 Drawing Sheets

(56)                    References Cited

U.S. PATENT DOCUMENTS

| | | | |
|---|---|---|---|
| 5,727,618 A | | 3/1998 | Mundinger et al. |
| 6,970,485 B1 * | | 11/2005 | Kitayama ............... H01S 5/024 |
| | | | 257/E23.098 |
| 2001/0004312 A1 * | | 6/2001 | Miyajima .......... H05K 7/20254 |
| | | | 361/689 |
| 2002/0195238 A1 * | | 12/2002 | Takigawa ................ H01S 5/024 |
| | | | 165/166 |
| 2003/0152488 A1 | | 8/2003 | Tonkovich et al. |
| 2005/0141574 A1 * | | 6/2005 | Sakano ................... H01S 5/023 |
| | | | 372/34 |
| 2006/0215715 A1 * | | 9/2006 | Kouta ................... H01L 23/473 |
| | | | 257/E23.098 |
| 2019/0036291 A1 * | | 1/2019 | Killi ........................ H01S 3/042 |

FOREIGN PATENT DOCUMENTS

| | | | |
|---|---|---|---|
| DE | 202017101126 A1 | 7/2018 | |
| GB | 1515658 A | 6/1978 | |
| JP | 61260937 | 11/1986 | |
| JP | 10209531 A | 8/1998 | |
| JP | 2004186527 A | 7/2004 | |
| JP | 2005217211 A | 8/2005 | |
| WO | 03068400 A1 | 8/2003 | |

* cited by examiner

METHOD FOR PRODUCING A COOLING ELEMENT, AND COOLING ELEMENT PRODUCED USING SUCH A METHOD

CROSS-REFERENCE TO RELATED APPLICATIONS

This application is a National Stage filing of PCT/EP2020/069049, filed Jul. 7, 2020, which claims priority to DE 10 2019 118 835.0, filed Jul. 11, 2019, both of which are incorporated by reference in their entirety herein.

BACKGROUND

The present invention relates to a method of manufacturing a cooling element and to a cooling element manufactured by such a method.

Cooling elements for cooling electrical and electronic components, in particular semiconductors such as laser diodes, are well known from the prior art. During operation, the electrical or electronic components generate heat which is dissipated by means of the cooling element in order to ensure permanent functionality of the electrical or electronic components. This applies in particular to laser diodes, where temperature differences of only a few ° C. can already lead to significant impairments in performance and/or service life.

For cooling the components, the cooling elements, which are usually attached to the components, typically have a cooling fluid channel system through which a cooling fluid is passed during operation in order to absorb and dissipate heat emanating from the electrical or electronic component. Preferably, a fin structure is used in which a plurality of web-like elements protrude into the cooling fluid channel system to provide the largest possible contact area with the cooling fluid, thereby improving heat transfer from walls bounding the cooling fluid channel system to the cooling fluid.

Accordingly, it is desirable to combine as many of these web-like elements as possible in the smallest possible space in order to ensure optimum cooling performance at the transition between the fin structure and the fluid.

The closest possible arrangement of adjacent web-like elements is limited by the smallest possible distance that can be achieved between two adjacent web-like elements by the manufacturing process.

Typically, the web-like elements are realized by a corresponding etching of a recess in a metal layer that supports the electrical or electronic components directly or indirectly via e.g. a ceramic-metal substrate, wherein the metal layer and possibly differently structured metal layers are stacked on top of each other along a stacking direction to form the cooling element with the cooling fluid channel system.

It has been found that comparatively small distances between adjacent web-like elements can be achieved with the thinnest possible metal layers, so that it has become established practice to stack several, preferably two to three, metal layers as thin as possible on top of each other in order to obtain web-like elements with a sufficiently large expansion along the stacking direction and at the same time a small distance between two adjacent web-like elements. However, in such an approach, a minimum distance between two adjacent web-like elements is limited to 0.3 mm or greater due to an offset occurring in a direction perpendicular to the stacking direction between the stacked metal layers.

On this basis, the present invention sets itself the object of providing a cooling element which has an improved cooling effect compared with the cooling elements known from the prior art, in which, in particular, finer-structured recesses for the cooling fluid channel system are possible.

SUMMARY

This object is solved by a method and a cooling element as described herein. Further advantages and features of the invention result from the subclaims as well as the description and the accompanying figures.

According to a first aspect of the present invention, there is provided a method for manufacturing a cooling element for an electrical or electronic component, in particular a semiconductor element, wherein the manufactured cooling element comprises a cooling fluid channel system through which a cooling fluid is passable in operation, comprising providing at least a first metal layer, realizing at least one recess in the at least one first metal layer, and forming at least a partial section of the cooling fluid channel system by means of the at least one recess, wherein at least a first part of the at least one recess in the at least one first metal layer is realized by erosion, in particular spark erosion.

BRIEF DESCRIPTION OF THE FIGURES

Further advantages and features result from the following description of embodiments with reference to the attached figures. Individual features of the individual embodiment can thereby be combined with each other within the scope of the invention, which show, in.

DETAILED DESCRIPTION

Figure 1:
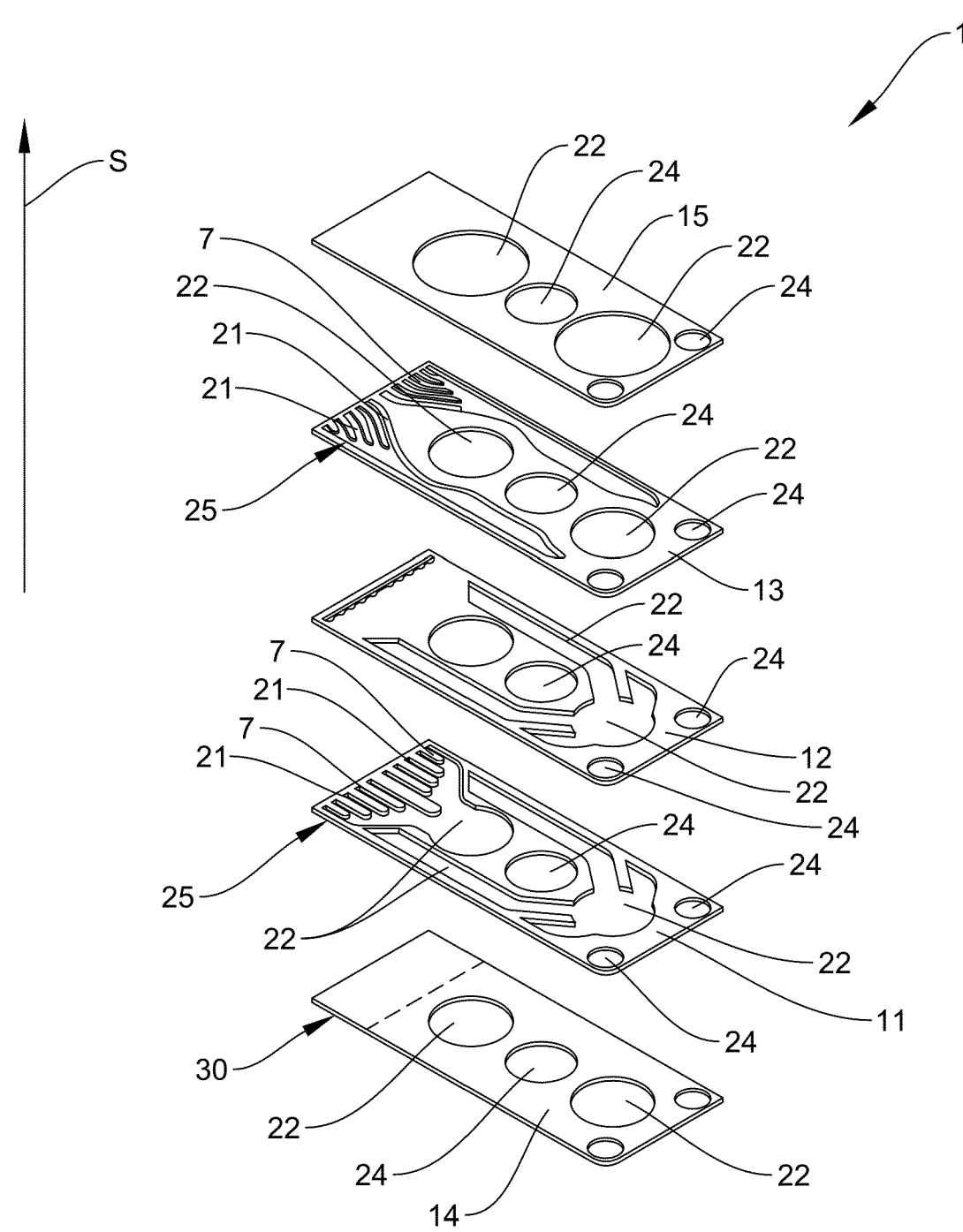
FIG. 1: a schematic exploded view of a cooling element according to a first exemplary embodiment of the present invention.

Compared to the methods known from the prior art, it is provided according to the invention to realize at least a part of the at least one recess in the at least one first metal layer by erosion, in particular by spark erosion (e.g. wire or sink erosion).

The erosion allows in particular to form very small or finely structured recesses or recess sections, in which in particular also recess sections, i.e. first parts of the at least one recess, can be realized, in which a distance between two opposite side surfaces, for example of adjacent web-like elements, in the at least one first metal layer can be assigned a value which is smaller than 0.3 mm. In a corresponding manner, recesses can be realized in a single first metal layer which form a very narrow channel section or section in the subsequently manufactured cooling fluid channel system through which the cooling fluid can be passed, in particular without having to stack several first metal layers on top of each other. As a result, much smaller and narrower cooling structures, e.g. fin structures in the cooling element, can be produced compared to those known from the prior art, so that a cooling effect of the cooling element can be significantly improved.

Preferably, the spark erosion or erosion is a thermal ablation for conductive materials, wherein the process is based on electrical discharge processes (sparks) between an electrode as tool and the at least one first metal layer. In particular, the spark erosion is carried out in accordance with the ablation according to the DIN 8580 standard. The at least one recess in the at least one first metal layer can extend through the entire at least one first metal layer (preferably produced by means of a wire erosion), or the at least one recess in the at least one first metal layer is formed in a blind hole-like manner (for example realized by a sink erosion in the at least one first metal layer).

During erosion, machining is carried out, preferably in a non-conductive medium, for example in oil or de-ionized water. The electrode tool is then brought to within 0.004 to 0.5 mm of the workpiece, i.e. to the at least one first metal layer. Subsequently, a flashover of sparks is selectively induced by an increase in an applied voltage, whereupon the generated sparks melt and vaporize the material in a punctiform manner so that the at least one recess is realized in the at least one first metal layer. Furthermore, it is preferably provided that the cooling element comprises a connection surface to which the electrical or the electronic component can be connected, wherein the at least one first part of the at least one first recess in the at least one first metal layer adjoins this connection surface. That is, the first portion of the at least one recess formed by erosion is adjacent to and/or formed in proximity to the connection surface.

Particularly preferably, the semiconductor element is a laser diode for which the cooling efficiency is significantly crucial for its power efficiency and lifetime. Furthermore, it is conceivable that the first part, which is manufactured by means of erosion, is part of a fin structure in the later manufactured cooling element. For example, the first part forms a gap between two web-like elements that are part of the fin structure through which the cooling fluid is passed for effective heat dissipation.

Preferably, the method further comprises:
providing at least one second metal layer; and
stacking the at least one first metal layer and the at least one second metal layer along a stacking direction to form the at least one section of the cooling fluid channel.

In particular, it is provided that the at least one first metal layer and/or the at least one second metal layer extend along a main extension plane and are stacked on top of each other along a stacking direction perpendicular to the main extension plane.

Preferably, the cooling element comprises at least one third metal layer, which also extends along a main extension plane and is arranged stacked in a direction perpendicular to the stacking direction together with the at least one first metal layer and the at least one second metal layer. In particular, it is provided that the at least one first metal layer, the at least one second metal layer and the at least one third metal layer differ from each other with respect to the position and shape of the at least one recess. In particular, it is provided that the at least one first metal layer, at least one second metal layer and/or at least one third metal layer arranged one above the other in the stacked state form the cooling fluid channel system through which the cooling fluid can be conducted during operation in order to conduct the heat away from the connection surface.

Preferably, at least a first portion of the at least one recess is formed by eroding in the at least one first metal layer, the at least one second metal layer and/or the at least one third metal layer. Furthermore, the cooling fluid channel system comprises, in particular, a supply region and a discharge region extending, for example, through the at least one first metal layer, the at least one second metal layer and/or the at least one third metal layer, the cooling fluid channel system preferably being configured such that, when the cooling fluid is transferred from the supply region to the discharge region, the cooling fluid must pass through the first part of the recess that has been created by eroding. Preferably, the cooling fluid passes through the fin structure during the transition from the supply region to the discharge region. In particular, it is intended that the cooling fluid passes through the cooling fluid channel system along the stacking direction, in particular passes through the fin structure along the stacking direction.

Furthermore, the cooling fluid channel system is designed such that the fluid conducted through the cooling fluid channel system is conducted from the at least one first metal layer via the at least one second metal layer into the at least one third metal layer, whereupon the fluid is deflected in the at least one third metal layer and is conducted back into the at least one second metal layer and/or the at least one first metal layer. Here, the cooling fluid again has access to the discharge region of the cooling fluid channel system and can be discharged from the cooling fluid channel system accordingly. Alternatively, it is conceivable that the first metal layer and/or the second metal layer form a fin structure in which fins project into a fluid channel past which the cooling fluid is guided along a single flow direction. In principle, a wide variety of designs of cooling fluid channel systems are conceivable in which the web-like elements are produced by means of erosion.

In addition to the at least one first metal layer, the at least one second metal layer and/or the at least one third metal layer, further corresponding metal layers and/or an upper cover layer and/or a lower cover layer are provided. If insulation is required between the cooling element and the electrical or electronic component, it is preferably provided that the upper cover element and/or the lower cover element is formed as a metal-ceramic composite, in which a ceramic layer is preferably arranged between two metal layers in order to provide the corresponding insulation. In contrast to the at least one first metal layer, the at least one second metal layer, and the at least one third metal layer, the upper cover member and/or the lower cover member may not have a first portion of the at least one recess created by erosion. Instead, the top cover layer and/or the bottom cover layer has recesses and/or further recesses which are provided as input opening and/or output opening for the supply area and/or discharge area of the cooling fluid channel system and/or as fastening means and locking aids for the cooling element.

According to one embodiment of the invention, it is provided that at least a second part of the recess in the at least one first metal layer is realized by etching. In this way, it is advantageously possible to form the at least one recess in two stages, wherein a large-area section or the second part of the recess is formed in a first preparatory step, for example by etching. Since, in particular for the large-area sections, the distance between two opposing side walls does not have to be as small as possible, it proves advantageous to use the established etching process here, whereas the finely structured recess sections or first parts of the recesses are produced by erosion, preferably in a manufacturing process following the etching. In this way, the complex eroding process can be limited to as small a section as possible in the at least one first metal layer. This has a positive effect on manufacturing time and manufacturing costs.

Preferably, the etching for forming the at least one second part of the at least one recess in the at least one first metal layer is provided temporally prior to forming the at least one first part of the at least one recess in the at least one first metal layer. Thereby, in an advantageous manner, with the creation of the second part, the access for the eroding for the formation of the first part is simplified, since, for example, a wire can be easily inserted into the already etched second part to subsequently cause the desired structure for the first part by means of eroding.

According to one embodiment of the invention, it is provided that the at least first part in the manufactured state has opposing side walls whose spacing is below a first threshold value and/or the at least second part in the manufactured state has opposing side walls whose spacing is above a second threshold value. Preferably, the first threshold value corresponds to the second threshold value. Accordingly, it is possible to delimit the first part of the at least one first recess from the at least second part of the at least one recess and to apply the corresponding process according to the required distances or dimensioning of the respective partial sections, which on the one hand ensures the smallest possible distances in the first part, whereas in the second part, due to the larger distances between two opposing side walls, there is no need to resort to the costly eroding process.

According to one embodiment of the invention, it is provided that several first metal layers are eroded simultaneously. In particular, it is intended to realize the first part of the recess in each case in several first metal layers stacked on top of each other simultaneously by means of wire erosion, so that several first metal layers are provided with the first part of the recess in a single erosion step. In particular, it has been found that up to 40 metal layers can be eroded simultaneously. In particular, this corresponds to a total density of the stacked first metal layers of about 4 cm. Accordingly, up to 40 first metal layers can then be realized in one eroding step, each of which later becomes part of a cooling element.

According to one embodiment of the invention, it is provided that the several first metal layers are fixed in a clamping element. By means of the clamping element, it is advantageously possible to transport the stacked first metal layers together and, in particular, to make them available for erosion together. For this purpose, the clamping element is in particular provided with openings that ensure access to the multiple first metal layers, so that simultaneous eroding of multiple first metal layers is possible. In particular, several first metal layers are arranged between a first fixing half and a second fixing half of the clamping element.

According to one embodiment of the invention, it is provided that the at least first metal layer has a thickness measured in the stacking direction of more than 0.3 mm, preferably more than 0.4 mm and particularly preferably more than 0.8 mm. In contrast to the processes known from the prior art, in which several thin at least first metal layers are placed one on top of the other, it is advantageously possible during erosion to provide first metal layers with recesses that are comparatively thick, in particular have thicknesses greater than 0.3 mm. This makes it possible in particular to realize very narrow but deep structuring in the at least one first metal layer without the need to stack several first metal layers on top of each other. This simplifies the manufacturing process and increases the stability and distinctiveness of the fin structure formed by the first part of the at least one recess in the at least one first metal layer.

Preferably, the at least one first metal layer and/or the at least one second metal layer is disposed between a lower cover layer and an upper cover layer. In other words, the at least one first metal layer and/or second metal layer do not form upper and lower cover layers. In particular, it is provided in this case that the at least one first metal layer has a thickness of more than 0.3 mm, preferably more than 0.4 mm and particularly preferably more than 0.8 mm. Finally, it has been shown that even with appropriately thick first metal layers between the upper and lower cover layers, it is possible to create an operationally reliable fluid channel that is also easy to assemble without the risk that a lateral offset of the individual layers relative to one another will lead to a constriction in the manufactured fluid channel. This allows particularly narrow fluid channels to be realized inside the cooling structure.

Furthermore, it is preferably provided that more than three, preferably more than five and particularly preferably more than seven first metal layers and/or second metal layers are provided, the thickness of which is greater than 0.3 mm. In other words, the use of comparatively thick first and/or second metal layers is not limited to individual layers, such as an outer covering layer or partial layer.

According to a further embodiment of the present invention, it is provided that all first metal layers and/or second metal layers have a thickness of more than 0.3 mm, preferably more than 0.4 mm and particularly preferably more than 0.8 mm.

For example, it is provided that all first and/or second metal layers have a thickness of 0.5 mm+/−0.2, preferably of 1 mm+/−0.4 mm and particularly preferably of 1.2 mm+/−0.5 mm.

Preferably, it is provided that the shapes of the at least one recess are different for at least three, preferably at least five and particularly preferably at least eight first metal layers. It has been found in an advantageous manner that complex cooling systems can also be realized by stacking the at least one first metal layer and/or the at least one second metal layer if they are in particular comparatively thick and have thin recesses.

Furthermore, it is preferably provided that the at least one first metal layer is bonded to the at least one second metal layer, preferably by sintering. In particular, it is provided that the at least one first metal layer is bonded to the at least one second metal layer, particularly preferably to the at least one third metal layer, without the use of an adhesion promoter or a brazing material. For example, they are joined together by appropriate heating in such a way that a monolithic base body for the cooling element is formed.

Furthermore, it is preferably provided that a single first metal layer is used to form the cooling element. Accordingly, a costly stacking of several thin first metal layers in a first section for the first metal layers can be dispensed with, so that the manufacturing process is significantly simplified. This is possible in particular because a thicker first metal layer can be used to realize the comparatively very thin structuring in the first section of the at least one recess.

A further object of the present invention is a cooling element manufactured by the method according to the invention, wherein a distance between opposing side walls in the first part of the at least one recess is smaller than 0.4 mm, preferably smaller than 0.3 mm and particularly preferably smaller than 0.2 mm. All properties and advantages described for the method can be transferred analogously to the cooling element and vice versa.

Furthermore, according to one embodiment of the invention, it is envisaged that the web-like elements project into the cooling fluid channel system in a straight line and/or at an angle and/or curved, in particular with respect to a central axis of the at least one first metal layer. Furthermore, it is conceivable that an orientation of the web elements or the web-like elements in the at least one first metal layer is different from the orientation or alignment of the web-like elements in the at least one third metal layer and/or at least one second metal layer. Preferably, the shape and design of the web-like elements can be adapted to the requirements in the respective application or for the respective electrical or electronic component. Preferably, it is provided that the distance between opposing side walls assumes a value between 0.10 and 0.3 mm, particularly preferably between 0.15 and 0.28 mm and especially preferably approximately a value of about 0.2. In addition to the dimensioning of the distances between two adjacent web-like elements, it has also been found to be advantageous not to make the distance between them too small so as not to significantly increase the pumping power for the passage of the cooling fluid in a corresponding manner. In a corresponding manner, the specified distances have turned out to be surprisingly advantageous trade-offs between optimized cooling efficiency and pumping power required for passing the cooling fluid through the cooling fluid channel system.

Further advantages and features will be apparent from the following description of preferred embodiments of the subject matter of the invention with reference to the accompanying figures. It shows:

FIG. 1 schematically shows an exploded view of a cooling element 1 according to a first preferred embodiment of the present invention. In particular, the cooling element 1 is one which is provided for cooling an electronic or electrical component (not shown), in particular a semiconductor element and particularly preferably a laser diode. For cooling the electrical or electronic component, the manufactured cooling element 1 forms a cooling fluid channel system through which a cooling fluid can be conducted in operation, so that the cooling fluid can absorb and carry away heat emanating from the electronic or electrical component in operation.

For this purpose, a supply area and a discharge area are preferably provided in the cooling element 1, in particular in the cooling fluid channel system (not shown), the cooling fluid being introduced via the supply area and being discharged again via the discharge area. Preferably, the cooling fluid channel system is designed in such a way that the cooling fluid 1 passes through a fin structure 25 at the transition from the supply area to the discharge area, which in particular projects into the cooling fluid channel system. The fin structure 25 is preferably a web-like element 7 that projects into the cooling fluid channel system in order to provide the largest possible contact surface for the fluid, so that an effective transfer of heat from the web-like element 7 or the wall of the cooling channel system to the fluid is possible.

Preferably, the cooling element 1 comprises at least one first metal layer 11, at least one second metal layer 12 and/or at least one third metal layer 13. To form the cooling fluid channel system, the at least one first metal layer 11, the at least one second metal layer 12 and/or the at least one third metal layer 13 are structured by at least one recess 21, 22 in such a way that they form the cooling fluid channel system by being stacked on top of each other or placed on top of each other along the stacking direction S.

In particular, it is provided that the at least one first metal layer 11, the at least one second metal layer 12 and/or the at least one third metal layer 13 are each structured differently or are provided with recesses 21, 22 extending differently. In particular, it is provided that the at least one first metal layer 11, the at least one secand metal layer 12 and/or the at least one third metal layer 13 form at least one first part 21 in the at least one recess 21, 22, which has the web-like elements 7 extending, in particular, in a main extension plane HSE extending perpendicularly to the stacking direction S. In addition to the first part 21 of the at least one recess 21, 22 in the at least one first metal layer 11, it is preferably provided that a second part 22 of the at least one recess 21, 22 in the at least one first metal layer 11 is provided for feeding or discharging the cooling fluid into or out of the first part 21 or forms part of the feed area and/or discharge area.

The cooling element 1 is preferably bounded in stacking direction S by an upper cover layer 15 and a lower cover layer 14, the at least one first metal layer 11, the at least one second metal layer 12 and/or the at least one third metal layer 13 being arranged between the lower cover layer 14 and the upper cover layer 15, as viewed in stacking direction S. In particular, the formation of the at least one first metal layer 11, the at least one second metal layer 12 and/or the at least one third metal layer 13 is sandwiched between the upper cover layer 15 and the lower cover layer 14. In addition to the at least one recess 21, 22, which is composed of the first part 21 and the second part 22, it is preferably provided that the cooling element 1 or the at least one first metal layer 11 has a further recess 24, which is not part of the cooling fluid channel system, with the fin structure 25. Furthermore, it is preferably provided that a connection surface 30 is provided at the upper cover layer 15 and/or the lower cover layer 14. In particular, the electrical or electronic component is connected to this connection surface 30, in particular as seen in the stacking direction S, above or below the fin structure 25, which preferably extends in a direction perpendicular to the stacking direction S. In other words, the fin structure 25, in particular its web-like elements 7, extends below the connection surface 30 and preferably parallel thereto. By the corresponding arrangement of the fin structure 25 consisting of the web-like elements 7 above or below the terminal area 30, the electrical or electronic component can be effectively cooled by means of the fin structure 25.

Figure 2:
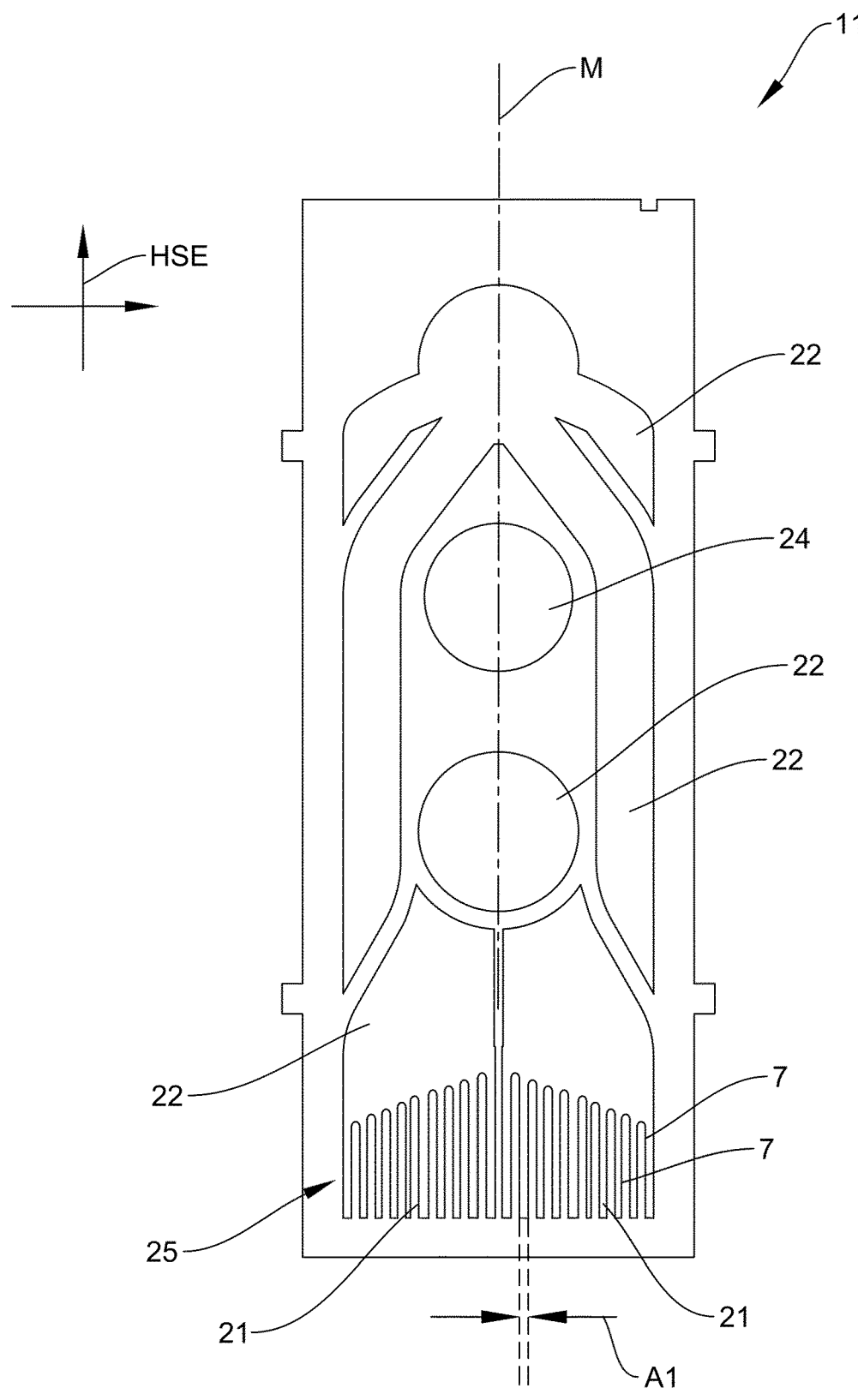
FIG. 2: a schematic representation of a first metal layer for a cooling element from FIG. 1, FIG. 3: a schematic representation of a cooling element according to a second exemplary embodiment of the present invention and, FIG. 4: a schematic representation of a clamping element for a method of manufacturing a cooling element according to a preferred embodiment of the present invention.

FIG. 2 shows a schematic representation of at least one first metal layer 11, which is installed, for example, in FIG. 1. In the embodiment shown, the fin structure 25 is formed of web-like elements 7 which, viewed in the main extension plane HSE, extend to different extents. In particular, a length of the web-like elements 7 increases towards a central axis M of the at least one first metal layer 11. In this way, it is possible in an advantageous manner to maximize the cooling effect as far as possible, in particular in the central region of the connection surface 30. Furthermore, it is conceivable that the web-like elements extend parallel and/or obliquely to the central axis M. Preferably, the shape of the web-like elements 7, in particular their length and/or inclination relative to the central axis M along the main extension plane HSE, is determined or specified by the corresponding requirement profile for cooling the corresponding electrical or electronic component.

In order to achieve the smallest possible distance A1 between two adjacent web-like elements 7, it is provided that the first part 21 of the at least one recess 21, 22 in the at least one first metal layer 11 is made by an erosion, in particular spark erosion. In particular, this is a manufacturing by means of wire erosion.

It is further provided that a second part 22 of the at least one recess 21, 22 is carried out by etching. Preferably, the etching is carried out in particular in large-area regions of the second part 22 of the recess 21, 22, i.e. in the subsequent supply and/or discharge regions which are formed for the supply and discharge of the cooling fluid. In contrast, it is particularly envisaged that eroding is provided for the finely structured formation of the recess 21, 22, i.e. the first part 21 of the recess 21, 22. It has been found that this makes it possible to produce comparatively very small distances between the web-like elements 7 without having to rely on several first metal layers 11 with etched first parts 21 of the at least one recess 21, 22, which would have to be stacked one on top of the other in order to realize the smallest possible distance between two web-like elements 7. Preferably, the distance A1 between opposing side walls between two web-like elements 7 is less than 0.4 mm, preferably less than 0.3 mm and particularly preferably less than 0.2 mm. This allows as many web-like elements 7 as possible to be integrated into the fin structure 25. Accordingly, it is possible to increase the cooling effect, since the contact area between cooling fluid and conversion of the cooling fluid channel system can be increased in a corresponding manner.

Preferably, the at least one first metal layer 11, the at least one second metal layer 12, the at least one third metal layer 13, the upper cover layer 15 and/or the lower cover layer 14 have a thickness measured in stacking direction S of between 0.2 and 0.7 mm, preferably between 0.35 and 0.6 mm and particularly preferably between 0.3 and 0.4 mm. Preferably, the at least one first metal layer 11, the at least one second metal layer 12 and/or the at least one third metal layer 13 each form the same thickness. Furthermore, it is preferably provided that the at least one first metal layer 11, the at least one second metal layer 12 and/or the at least one third metal layer 13 are formed into an integral cooling fluid channel system in the course of a sintering process, in that the microstructures of the at least one first metal layer 11, the at least one second metal layer 12 and/or the at least one third metal layer 13 merge or fuse into one another by means of a corresponding temperature treatment. Furthermore, it is provided that also the upper cover layer 15 and/or the lower cover layer 14 each have at least one recess 21, 22 and/or a further recess 24, wherein the upper cover layer 15 and/or the lower cover layer 14 are preferably free of web-like elements 7 or components of a subsequent fin structure 25. The further recesses 24 preferably serve for fastening or fixing the cooling element 1.

Figure 3:
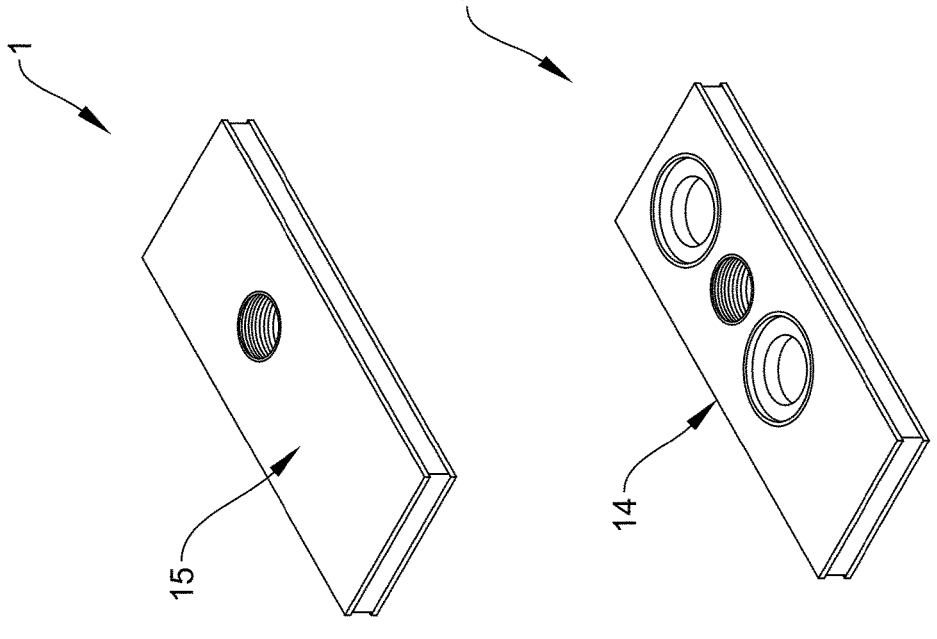
Figure 3:
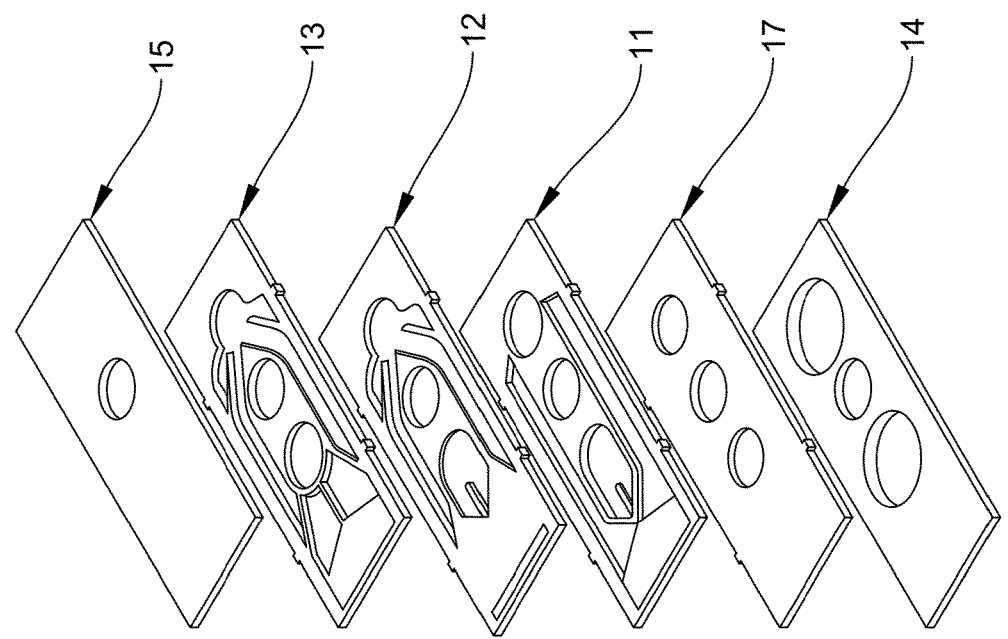

FIG. 3 shows a cooling element 1 according to a second preferred embodiment. Here the cooling element 1 corresponds essentially to the cooling element 1 in FIG. 1 and differs essentially only in that the lower cover layer 14 and/or the upper cover layer 15 is formed as a metal-ceramic composite. In particular, it is provided in this case that the upper cover layer 15 and/or the lower cover layer 14 each have a ceramic layer, preferably of aluminum nitride, which is covered on both sides, for example, with a metal layer, preferably a copper layer. For example, it is a ceramic layer of aluminum nitride whose thickness, measured in the stacking direction S, assumes a value of 0.1 mm to 0.5 mm, preferably 0.2 mm to 0.4 mm and particularly preferably substantially 0.38 mm, while the outer metal layers covering the ceramic layer in each case have a thickness of between 0.05 and 0.4 mm, preferably between 0.1 and 0.3 mm and particularly preferably between 0.15 and 0.25 mm.

In particular, it is intended that the metal layers formed on opposite sides of the ceramic layer have different thicknesses. For example, one metal layer has a copper thickness of 0.2 mm, while the opposite copper layer has a thickness of 0.12 mm, which is realized in particular by diamond grinding after the bonding process of the metal layer to the copper layer. Preferably, the upper cover layer 15 and/or the lower cover layer 14 is a metal-ceramic composite produced by means of a DCB process.

Furthermore, it is preferably provided that the cooling element 1 of FIG. 3 has a sealing element support layer 17 in which or with which, for example, O-rings can be fixed in order to ensure a corresponding seal in the connection region for the feed and discharge regions of the cooling element 1. Preferably, the sealing element support layer 17 is a metal layer with corresponding recesses 21, 22 or further recesses 24, wherein the sealing element support layer 17 can have a thickness, measured in the stacking direction, of between 0.1 and 0.4 mm, preferably between 0.1 and 0.4 mm and particularly preferably between 0.2 and 0.3 mm.

Furthermore, the embodiment of FIG. 3 differs from that of FIG. 1 in that the cooling element 1 is closed at its upper cover layer 15 and an inlet opening for supplying the cooling fluid and an outlet opening for discharging the cooling fluid are formed exclusively at the lower cover layer 14, so that the cooling fluid which is introduced into the cooling element 1 via the lower covering layer 14 passes through the latter along the stacking direction S and is deflected in the at least one third metal layer 13, and then leaves the cooling element 1 again in the opposite direction. The upper cover layer 15 and lower cover layer 14 made of a metal-ceramic composite prove to be particularly advantageous for those applications in which the cooling element 1 must be electrically insulated from the component which is attached to the cooling element 1 or to the cooling element 1.

Figure 4:
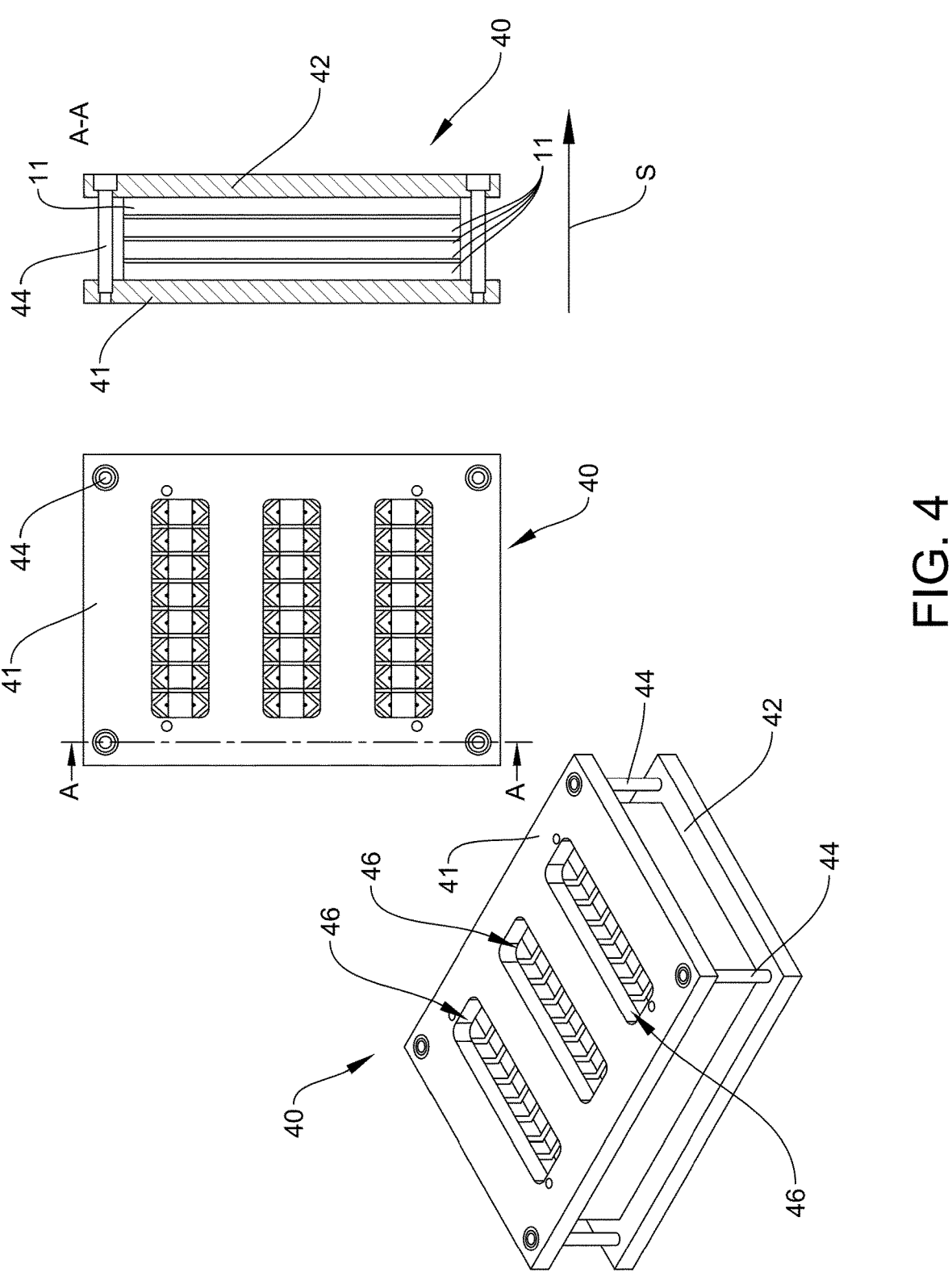

FIG. 4 shows a schematic representation of a clamping element 40 for a method of manufacturing a cooling element 1 according to a preferred embodiment of the present invention. In particular, it is provided here that the clamping element 40 is designed to receive a plurality of first metal layers 11. In particular, a plurality of first metal layers 11 are arranged one above the other along the stacking direction S in the clamping element 40. Preferably, up to 20 first metal layers 11, preferably up to 30 first metal layers and particularly preferably up to 40 first metal layers 11 are arranged one above the other in the clamping element 40 along the stacking direction S and are clamped in a sandwich-like manner between a first fixing half 41 and a second fixing half 42.

In this context, it is provided in particular that the first fixing half 41 and the second fixing half 42 are designed as plate-like components which are arranged opposite one another and, in particular, preferably each have openings 46, in particular window-like or hatch-like openings 46, which allow access to be granted to the first metal layers 11 arranged between the first fixing half 41 and the second fixing half 42. Thereby, it is possible that the first metal layers 11 arranged between the first fixing half 41 and the second fixing half 42 are eroded together for forming at least the respective first part 21 of the at least one recess 21, 22 in the at least first metal layer 11.

Preferably, before being clamped between the first fixing half 41 and the second fixing half 42, the first metal layers 11 are already provided with an etched-in or etched-on structure which, in the later manufactured state of the first metal layer 11, preferably provides the second part 21 of the at least one recess 21, 22 before being assembled into the cooling elements. Accordingly, this makes it possible to realize large-area sections in the at least one recess 21, 22 in the at least one first metal layer 11 by large-area etching, while the fine-structured web-like elements 7 are realized by the common wire erosion. Furthermore, it is advantageously possible to provide the already pre-etched first metal layers 11 to the EDM together by the clamping element 40 or to transport the first metal layers 11 suitably in this clamping element 40. In this connection, it is particularly preferably provided that the first fixing half 41 and the second fixing half 42 are connected to one another via a corresponding fixing means 44 or are connected in such a way that they fix the first metal layers 11 arranged between them. For example, the fastening means 44 is a screw.

Preferably, a fastening means 44 is provided at each corner of the clamping element 40 for uniform tightening. In this context, it is particularly provided that the fixing means 44 can sufficiently fix the plurality of first metal layers 11 as far as possible independently of the exact number of first metal layers 11. That is, the distance between the first fixing half 41 and the second fixing half 42 can be variably adjusted, in particular by the corresponding fixing means 44, so that corresponding deviations in the number of first metal layers 11 can be easily compensated. The jointly eroded first metal layers 11 can then each be used to form a respective cooling element 1, which preferably requires only a single first metal layer 11. The procedure described here for the at least one first metal layer 11 can of course be transferred in an analogous manner to the at least one second metal layer 12 and/or the at least one third metal layer 13.

LIST OF REFERENCE SIGNS 1 cooling element
7 web-like element
11 first metal layer
12 second metal layer
13 third metal layer
14 lower surface layer
15 upper surface layer,
17 sealing element support layer
21 first part of the recess
22 second part of the recess
24 further recess
25 fin structure
30 connection area
40 clamping element
41 first fixing half
42 second fixing half
44 fixing means
46 opening
A1 distance
S stacking direction
M middle axis
HSE main extension plane

The invention claimed is:

1. A method for manufacturing a cooling element (1) for an electrical or electronic component, the manufactured cooling element (1) having a cooling fluid channel system through which a cooling fluid can be passed in operation, comprising
    providing at least a first metal layer (11),
    realizing at least one recess (21, 22) in the at least one first metal layer (11), and forming at least a partial section of the cooling fluid channel system by means of the at least one recess (21, 22),
    wherein at least a first part (21) of the at least one recess (21, 22) in the at least one first metal layer (11) is realized by erosion, characterized in that
    at least a second part (22) of the at least one recess (21, 22) in the at least one first metal layer (11) is realized by an etching.

2. The method according to claim 1, further comprising:
    providing at least one second metal layer (12), and
    stacking the at least one first metal layer (11) and the at least one second metal layer (12) along a stacking direction(S), forming the at least one section of the cooling fluid channel system.

3. The method of claim 1, wherein the etching to form the at least one second portion (22) of the at least one recess (21, 22) in the at least one first metal layer (11) occurs temporally prior to forming the at least one first portion (21) of the at least one recess (21, 22) in the at least one first metal layer (11) by the eroding.

4. The method according to claim 1, wherein a plurality of first metal layers (11) are eroded simultaneously.

5. The method according to claim 4, wherein the plurality of first metal layers (11) are fixed in a clamping element (40).

6. The method according to claim 1, wherein the at least one first metal layer (11) has a thickness of more than 0.3 mm.

7. The method according to claim 1, wherein the at least one first metal layer (11) and/or the at least one second metal layer (12) is arranged between a lower cover layer (14) and an upper cover layer (15).

8. The method according to claim 1, wherein more than three first metal layers (11) and/or second metal layer (12) are provided, the thickness of which is greater than 0.3 mm.

9. The method according to claim 1, wherein all first metal layers (11) and/or second metal layers (12) have a thickness of more than 0.3 mm.

10. The method according to claim 1, wherein the shapes of the at least one recess (21, 22) are different for at least three first metal layers (21).

11. The method according to claim 1, wherein the at least one first metal layer (11) is bonded to the at least one second metal layer (12).

12. The method according to claim 1, wherein a single first metal layer (11) is used to form the cooling element (1).

13. A cooling element (1) produced by a method according to claim 1, wherein a distance (A1) between opposing side walls in the at least one first metal layer (11) is at least in regions smaller than 0.4 mm.

14. The cooling element of claim 13, wherein the distance (A1) between opposing side walls in the at least one first metal layer (11) is at least in regions smaller than 0.3 mm.

15. The cooling element of claim 13, wherein the distance (A1) between opposing side walls in the at least one first metal layer (11) is at least in regions smaller than 0.2 mm.

16. A method for manufacturing a cooling element (1) for a semiconductor element, the manufactured cooling element (1) having a cooling fluid channel system through which a cooling fluid can be passed in operation, comprising
    providing at least a first metal layer (11),
    realizing at least one recess (21, 22) in the at least one first metal layer (11), and
    forming at least a partial section of the cooling fluid channel system by means of the at least one recess (21, 22), wherein at least a first part (21) of the at least one recess (21, 22) in the at least one first metal layer (11) is realized by spark erosion, and wherein at least a second part (22) of the at least one recess (21, 22) in the at least one first metal layer (11) is realized by an etching, the etching to form the at least one second portion (22) of the at least one recess (21, 22) in the at least one first metal layer (11) occurs temporally prior to forming the at least one first portion (21) of the at least one recess (21, 22) in the at least one first metal layer (11) by the eroding.

17. The method according to claim 16, further comprising:

providing at least one second metal layer (12), and stacking the at least one first metal layer (11) and the at least one second metal layer (12) along a stacking direction(S), forming the at least one section of the cooling fluid channel system.

18. The method according to claim 16, wherein the at least one first metal layer (11) has a thickness of more than 0.4 mm.

19. The method according to claim 16, wherein the at least one first metal layer (11) has a thickness of more than 0.8 mm.

20. The method according to claim 17, wherein more than five first metal layers (11) and/or second metal layers (12) are provided, the thickness of which is greater than 0.3 mm.

21. The method according to claim 17, wherein more than seven first metal layers (11) and/or second metal layers (12) are provided the thickness of which is greater than 0.3 mm.

22. The method according to claim 17, wherein all first metal layers (11) and/or all second metal layers (12) have a thickness of more than 0.3 mm.

23. The method according to claim 17, wherein all first metal layers (11) and/or all second metal layers (12) have a thickness of more than 0.4 mm.

24. The method according to claim 17, wherein all first metal layers (11) and/or all second metal layers (12) have a thickness of more than 0.8 mm.

25. The method according to claim 16, wherein a shape of the at least one recess (21, 22) is different for least three first metal layers (21).

26. The method according to claim 17, wherein the at least one first metal layer (11) is bonded to the at least one second metal layer (12).

27. The method according to claim 16, wherein a single first metal layer (11) is used to form the cooling element (1).

28. A cooling element (1) produced by a method according to claim 16, wherein a distance (A1) between opposing side walls in the at least one first metal layer (11) is at least in regions smaller than 0.4 mm.

* * * * *